(12) United States Patent
Teppan

(10) Patent No.: US 6,876,291 B2
(45) Date of Patent: Apr. 5, 2005

(54) ELECTRICAL RESISTOR FOR MEASURING PREFERABLY HIGH-FREQUENCY ALTERNATING CURRENTS

(75) Inventor: Wolfram Teppan, Collonges sous Saleve (FR)

(73) Assignee: Lem Norma GmbH, Brunn am Gebirge (AT)

( * ) Notice: Subject to any disclaimer, the term of this patent is extended or adjusted under 35 U.S.C. 154(b) by 0 days.

(21) Appl. No.: 10/239,819

(22) PCT Filed: Jan. 4, 2002

(86) PCT No.: PCT/AT02/00001
§ 371 (c)(1),
(2), (4) Date: Sep. 24, 2002

(87) PCT Pub. No.: WO02/054089
PCT Pub. Date: Jul. 11, 2002

(65) Prior Publication Data
US 2003/0038620 A1 Feb. 27, 2003

(30) Foreign Application Priority Data
Jan. 4, 2001 (AT) ................................ 19/2001

(51) Int. Cl.[7] ............................................ H01C 10/00
(52) U.S. Cl. ............................ 338/61; 338/62; 338/63; 338/307; 338/254; 338/328
(58) Field of Search ............................ 338/307, 254, 338/255, 328, 49, 61, 62, 63, 58

(56) References Cited

U.S. PATENT DOCUMENTS

| | | | | |
|---|---|---|---|---|
| 1,146,592 A | * | 7/1915 | Northrup | 338/49 |
| 1,260,252 A | * | 3/1918 | Apfel | 338/307 |
| 2,726,304 A | * | 12/1955 | Gribble | 338/307 |
| 2,945,180 A | * | 7/1960 | Parker | 338/307 |
| 3,636,493 A | * | 1/1972 | Caddock | 338/52 |
| 5,053,743 A | * | 10/1991 | Mille et al. | 338/297 |
| 5,994,997 A | * | 11/1999 | Brown et al. | 338/309 |
| 6,166,619 A | * | 12/2000 | Baiatu et al. | 338/61 |
| 6,208,234 B1 | * | 3/2001 | Hunt et al. | 338/308 |
| 6,246,312 B1 | * | 6/2001 | Poole et al. | 338/307 |
| 6,452,477 B1 | * | 9/2002 | Roca et al. | 338/61 |

FOREIGN PATENT DOCUMENTS

| | | |
|---|---|---|
| CA | 1 253 570 | 5/1989 |
| DE | 36 11 595 | 10/1987 |
| EP | 0 500 975 A1 | 9/1992 |
| EP | 0 500 976 A1 | 9/1992 |
| FR | 2079959 | 11/1971 |

* cited by examiner

Primary Examiner—Karl Easthorn
(74) Attorney, Agent, or Firm—Merchant & Gould, P.C.

(57) ABSTRACT

The present invention relates to an electrical resistor (1), in particular for measuring alternating currents of high frequency, comprising connectors (2, 3) for feeding the current to be measured and connectors (4, 5) for tapping the voltage to be measured and having a layered structure including at least one resistive layer (10), a return conducting layer (11) and any possibly provided insulating layers (7, 12, 21, 22, 24). To obtain a measuring resistance having a particularly good frequency response, a high long-term stability and an efficient cooling and which, moreover, is inexpensive to produce, it is provided for the resistive layer (10) together with the return conducting layer (11) and the possible insulating layers (7, 12, 21, 22, 24) to be part of a multilayered printed circuit board and to comprise a plurality of conductive tracks (14) extending from a central region of the resistive layer (10) towards outside. Preferably, the return conducting layer (11) comprises conductive tracks (15) of the same geometrical shape as the conductive tracks (14) of the resistive layer (10).

9 Claims, 4 Drawing Sheets

ELECTRICAL RESISTOR FOR MEASURING PREFERABLY HIGH-FREQUENCY ALTERNATING CURRENTS

Figure 1:
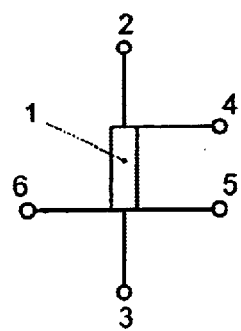

The invention relates to an electrical resistor for measuring preferably high-frequency alternating currents with connectors for feeding the current to be measured and connectors for tapping the voltage to be measured and with a layered structure comprising at least one resistive layer of a return-conducting layer and any possibly provided insulating layers.

Resistors intended for measuring currents are termed shunt resistors or shunts. Just like current transformers, they are simple passive current sensors, yet with somewhat different properties. On the one hand, constructions for measuring direct currents, and, on the other hand, extremely wide-band types capable of measuring currents having frequencies up to the gigahertz range are widely used. In measurement resistors for measuring alternating currents of a particularly high frequency care must be taken that the inductivity of the shunt is low, and that the unavoidable residual magnetic field will have as little influence as possible on the current to be measured. For this purpose attempts are made to link this residual magnetic field not only with the current to be measured, but also with the measuring circuit in a manner that the inductive component of the voltage will be cancelled out at the measurement tap. Simple wire-wound resistors are not suitable for measuring an alternating current because of the high inductivity of the coil winding.

To reduce the inductivity of measurement resistors, also measurement resistors of bifilar structure are known, in which, however, the loop formed by the measurement resistor and the measuring leads still comprises a certain portion of the magnetic flux that is linked with the current to be measured.

To overcome the difficulties found in measurement resistors having a bifilar winding, coaxial arrangements have been reverted to, which consist of an inner cylinder made of a thin resistive material and a normally conductive outer cylinder, the current to be measured being supplied via the inner lead and returned via the outer lead, the voltage tap, the so-called Kelvin tap, being effected in the inner cylinder in the field-free space, and thus there being no induction of a voltage by the current to be measured. Such coaxial resistors are suitable for high currents and frequencies up to the gigahertz range. Coaxial shunts do have a good frequency response, yet they require considerable manufacturing expenditures and therefore are too expensive for many applications. The actual limitation of the band width of coaxial measurement resistors is not caused by the voltages induced by the Rayleigh scattering fluxes in the measuring loop, but by the current displacement phenomena in the interior of the resistor cylinder.

U.S. Pat. No. 5,596,309 A, e.g., describes a coaxial measurement resistor with reduced inductivity, wherein, between the inner cylindrical resistor and the outer cylinder, an insulator which also is cylindrical in shape is arranged, whereby the distance between the outer conductor and the inner resistor is reduced and thus the magnetic scatter flux can be decreased. Besides the reduced inductivity, a coaxial shunt constructed in this manner also has a high stability if a suitable resistor material is used.

Besides the aforementioned coaxial measurement resistors, also so-called disk resistors are known in which a disk of a material with good conductivity is arranged above a disk made of resistive material. By co-axially arranging the current supply and the voltage tap, the inductivity can be reduced, yet a certain residual inductivity will always remain. Although such disk resistors have a simpler construction as compared to coaxial measurement resistors, they still have disadvantages as regards their production and their electrical properties.

Furthermore, measurement resistors of layered arrangement are known which are much easier to produce and thus cheaper as compared to the aforementioned constructions. Such a resistor is, e.g., described in CA 1 253 570 A, wherein conductive layers are arranged on the outer sides of a printed circuit board, a current flow alternating between the two conductive layers occurring by appropriate feed-throughs. In this manner, a construction is provided which has good electrical properties and at the same time is inexpensive to produce and has a simple construction. The feed-throughs located in the path of the current to be measured cause a deterioration of the temperature coefficient. The decrease of the inductive portion of the voltage to be measured is effected by an arrangement by which the fields of the individual conductor pieces are to cancel each other out in the region of the potential taps without limiting the spreading of the magnetic field.

Another electrical resistor formed by the assembly of layers for measuring a high-frequency alternating current, in particular with resistance values in the milliohmic range, is described in DE 36 11 595 A1. This measurement resistor is formed of two resistance films and outer metal plates between which insulating adhesive films are provided. Strip-shaped connecting layers provided on the rim of the adhesive films serve to electrically connect the resistance films with each other or with the metal plates. A measurement resistor assembled in this manner is relatively simple to produce and thus also substantially cheaper as compared to coaxial resistors. Thus, the fields of application of such measurement resistors can be extended, e.g. for checking rapid current sources or current sinkings, HF transmitters, variable frequency inverters or clocked power supply units in which alternating currents up to a few hundreds of amperes having frequencies of up to 100 MHz may occur. Due to the fact that the currents in the resisting film and in the conductive metal plates are oppositely directed and their magnetic fields which form at approximately the same site nearly cancel each other out, such a resistor only produces a correspondingly small total magnetic field. At the connecting layers on the rim of the adhesive foils, however, magnetic fields still do occur, causing a slight inductivity of the measurement resistor and thus limiting the precision of measurement, and the band width of the resistor, respectively. The strip-shaped connecting layers for connecting the superposed resistive layers cause a deterioration of the temperature coefficient.

A measurement resistor of the present type is also known from EP 500 975, in which the resistive layer and the return conducting layer are interconnected at one end by feed-throughs and potential connectors are provided in the other end region. Although this embodiment is substantially easier to produce as compared to coaxial arrangements, undesired magnetic fields influencing the measurement result do occur, particularly in the rim regions of the measurement resistor.

Therefore, the present invention has as its object to provide an electrical measurement resistor of the above-mentioned type, which has as good electrical properties as possible, such as a low inductivity, a constant frequency response and phase angle for as high a band width as possible as well as for a high longtime stability and which is as easy to produce as possible. Moreover, cooling of the measurement resistor is to be possible in a simple and efficient manner. Disadvantages of known measuring shunts are to be avoided or at least reduced.

The object according to the invention is achieved in that the resistive layer together with the return conducting layer and the possible insulating layers is part of a multilayered printed circuit board and comprises a plurality of conductive tracks extending from a central region of the resistive layer towards outside. By such a compact assembly, a simple producibility will be possible by the multilayer technology common in the production of printed circuit boards, which can simply be automated. Moreover, the compact multilayer arrangement is expected to yield a high long-term stability, since a corrosion by outer influences is almost completely avoided. The conductive tracks leading from the inside to the outside will cause a uniform current density distribution and, thus, a uniform heating. In the simplest case, the return conducting layer may be made of a continuous copper layer. Moreover, conductive tracks may also be provided in the return conducting layer.

Advantageously, the return conducting layer comprises conductive tracks of the same geometrical shape as the conductive tracks of the resistive layer. In this manner, very low undesired magnetic fields are allowed, since the currents on the current tracks of the resistive layer are oppositely directed to those in the conductive tracks of the return conducting layer and their magnetic fields which form approximately at the same location nearly cancel each other out. The corresponding, e.g. spiral-shaped conductive tracks on the resistive layer as well as on the return conducting layer may be prepared by the methods commonly used in the production of printed circuit boards in a simple and low-cost manner.

Advantageously, the resistive layer and the return conducting layer are substantially circular in top view. In this manner, circular-symmetrical conditions will be attained.

According to a further feature of the invention it is provided for the conductive tracks of the resistive layer and of the return conducting layer to have a substantially constant width and a substantially constant distance from each other. Such a geometrical shape enhances the technical effect of the constant current density distribution across the resistive layer and, thus, the uniform heating.

In a substantially circular resisting layer, this is particularly achieved by conductive tracks extending spirally outwards from the central region. Depending on the number of conductive tracks extending outwards from the center of the resistive layer and of the return conducting layer, the suitable type of the spiral shape can be calculated by respective mathematical methods.

According to a further feature of the invention it is provided for the connectors for feeding the current to be measured and/or the connectors for tapping the voltage to be measured to be led to the desired layer through respective feed-throughs, so-called vias. In this manner, feed lines are prevented in which undesired voltages could be induced which would falsify the current to be measured. The magnetic flux remaining between the resistive layer and the return conducting layer is not linked with the current measured via the Kelvin tap and thus does not contribute to the measurement signal.

Advantageously, at least one insulating layer consists of one or more prepreg layers, preferably having a thickness of less than 0.1 mm.

If the resistive layer is arranged between the return conducting layer and a connector layer comprising the connectors for tapping the voltage to be measured, a linking of the magnetic flux of the current to be measured with the conductors of the Kelvin tap can largely be prevented.

A good dissipation of the loss heat is provided for in that the insulating layer provided between the return conducting layer and the possible cooling body is made of solder resist or solder stop film and thus is very thin.

The invention will be explained in more detail by way of drawings which illustrate an exemplary embodiment of the invention. Therein, FIG. 1 shows a schematic circuit diagram to illustrate the connectors of the measurement resistor, FIG. 2 is a perspective exploded view of a measurement resistor according to the present invention, FIGS. 3a to 3f show top views onto the various layers of the measurement resistor according to FIG. 2, and FIG. 4 shows a schematic cross-section through the layered structure of the present measurement resistor so as to illustrate the thickness ratios.

FIG. 1 shows a substitute circuit diagram of a measurement resistor 1 including a diagram of the connectors. Via connectors 2, 3, the current to be measured is conducted through the measurement resistor 1, and via connectors 4, 5 (Kelvin connectors), the voltage to be measured is tapped. Connector 6 serves to connect a screen for the Kelvin tap.

Figure 2:
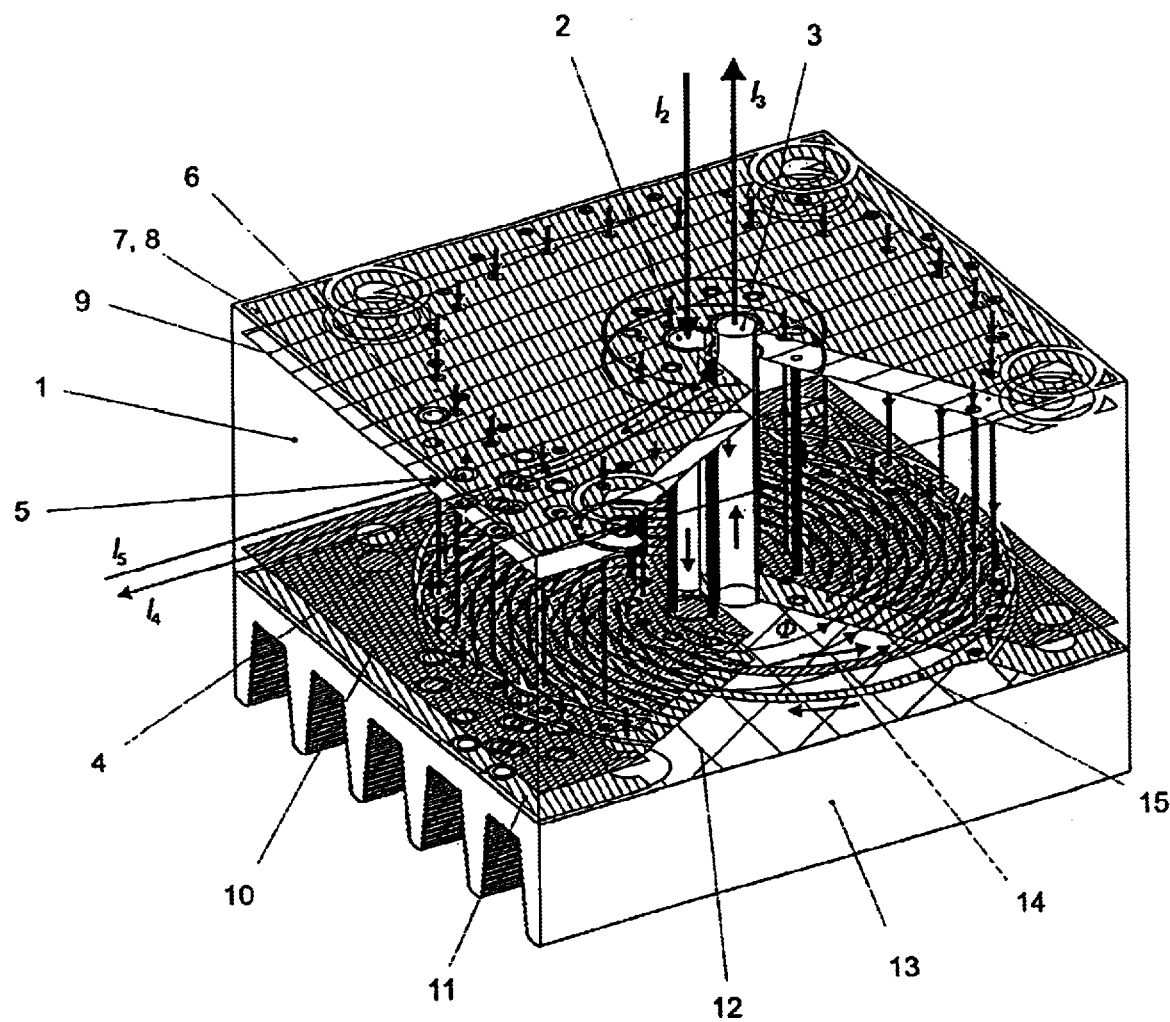

In FIG. 2, the measurement resistor 1 produced according to the invention in a layered structure is illustrated. The layers are the resistive layer 10, the return conducting layer 11, an interconnecting layer 9 and a connector layer 8 as well as solder stop layers 7 and 12. The individual layers 7, 8, 9, 10, 11 and 12 have been illustrated in exploded view and partially sectioned so as to be easier to demonstrate. Via connectors 2 and 3, the current to be measured is introduced into the measurement resistor 1 and conducted back therefrom again. The connectors 2 and 3 are located at the center of the measurement resistor 1 and are correspondingly fed through to the return conducting layer 11, and to the resistive layer 10, respectively. Tapping of the voltage is effected via connectors 4, 5 in connector layer 8. A cooling body 13 preferably is arranged below the return conducting layer 11, e.g. glued or screwed thereto, an insulation, preferably formed by the insulating layer 12 consisting of solder resist applied to the return conducting layer 11 possibly being provided. In the resistive layer 10, the current flows along the spiral-shaped conductive tracks 14 from the inside to the outside, and in the return conducting layer 11 along likewise designed conductive tracks 15 from the outside back to the inside to the connector 3 of the measurement resistor 1. From the outside of the resistive layer 10, corresponding feed-throughs 18 lead to the outside of the return conducting layer 11. In the printed circuit board, all the connectors 2, 3, 4, 5, 6 consist of metallized bores. In the connecting layer 9 which, just as the connector layer 8 and the return conducting layer 11 preferably is made of copper, a part of the current to be measured is distributed to the feed-throughs 16 so as to restrict the current density upon its entry into the resistive layer 10. The connection to the connector 4 consists of the feed-throughs 17 and the conductive track in the connector layer 8. Via the feed-throughs 19 and the outer conducting surface of the connector layer 8, the connection to the Kelvin connector 5 with the resistive layer 10 is effected. Via the feed-throughs 18, the current to be measured gets to the outer ends of the conductive tracks 15 in the return conducting layer 11. Via the feed-throughs 18, also a connection of the resistive layer 10 with the connecting layer 9 leading to connector 6 is effected. This copper layer 9 also serves as a screen for the Kelvin tap in its course on the printed circuit board.

Figure 3A:
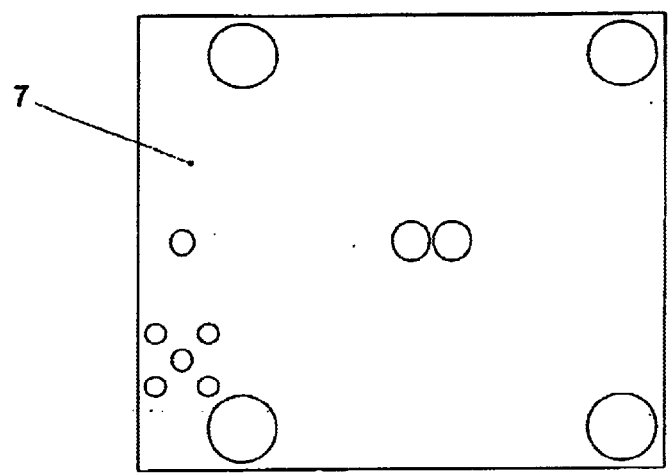
Figure 4:
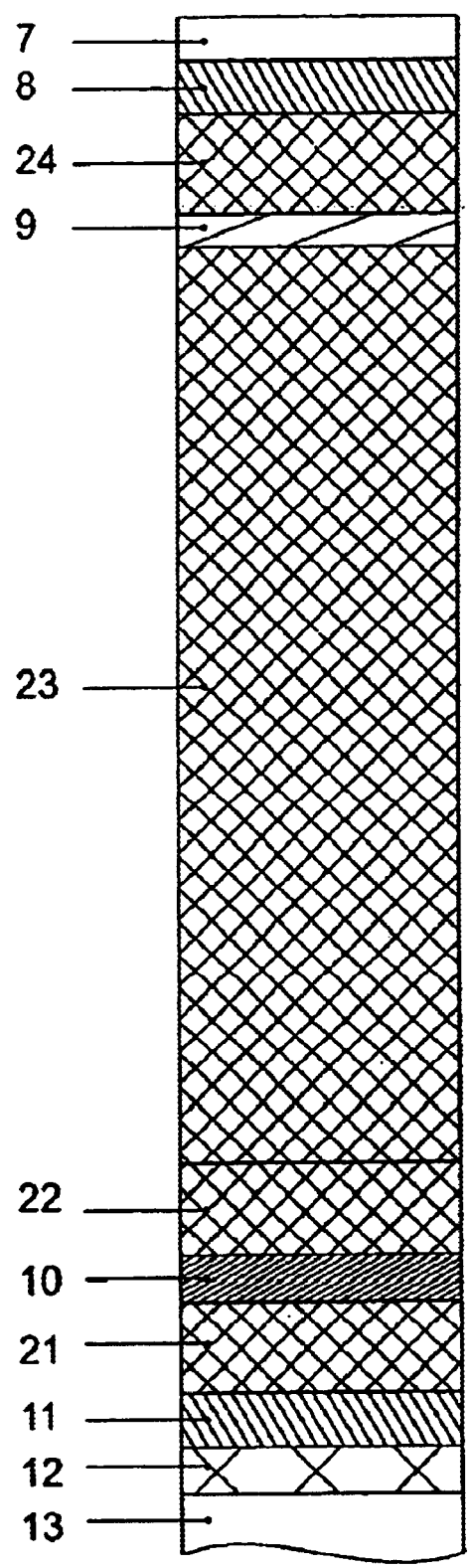

FIG. 3a shows the uppermost insulating layer 7, shown as transparent in FIG. 2, of the measurement resistor 1 which represents the solder stop mask. At sites of the connectors 2, 3 for the current to be measured and the connectors 4, 5 for the voltage tap, as well as of the connector 6 for the screen, as well as at sites of any bores 20 possibly provided for fastening elements, the insulating layer 7 (solder resist) is not applied.

Figure 3B:
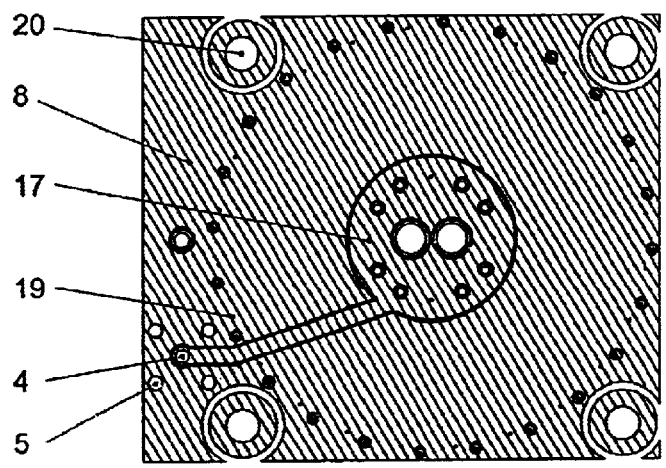
Figure 3C:
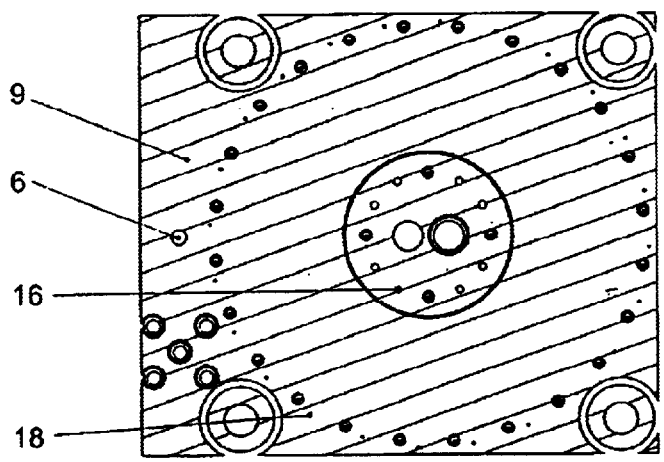
Figure 3D:
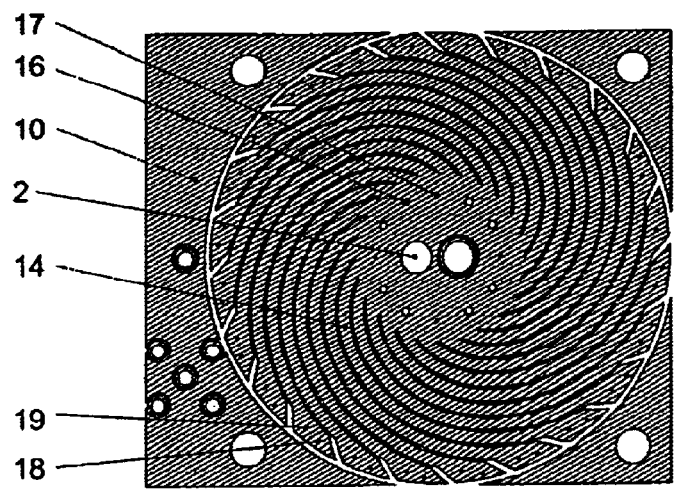

FIG. 3b shows the connector layer 8 which constitutes the connection from the Kelvin connector 4 into the center of the layer, where a connection to the resistive layer 10 is effected via the feed-throughs 17 according to FIG. 3d.

FIG. 3c shows the connecting layer 9 which, e.g., is made of copper and causes a connection of connector 2 to the underlying resistive layer 10 via the feed-throughs 16.

FIG. 3d shows a centrosymmetric resistive layer 10 of the measurement resistor 1, which preferably is formed by an alloy having a low temperature coefficient. The figure clearly shows the spiral-shaped conductive tracks 14 which have a substantially constant distance from each other and which have a substantially constant width. In the example illustrated, the resistive layer 10 comprises a total of 24 spirally outwardly extending conductive tracks 14. This number can be changed appropriately, a certain minimum number being required to attain symmetrical conditions. By the substantially constant width of the conductive tracks 14, a constant current density distribution across the resistive layer 10, and thus a constant heating, is attained.

Figure 3E:
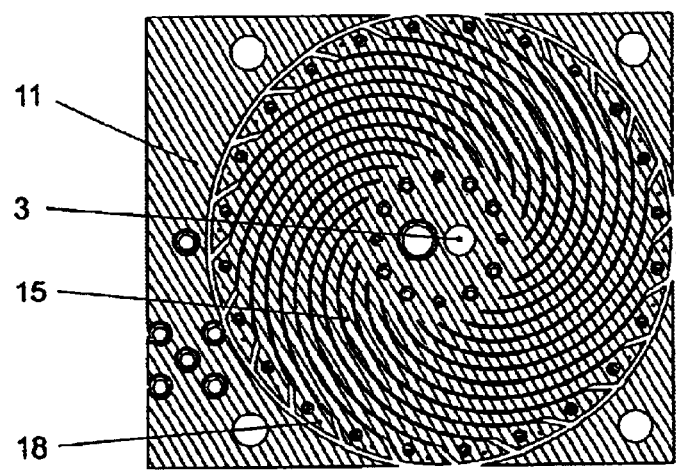

FIG. 3e shows a centrosymmetric return conducting layer 11 arranged below the resistive layer 10 which has the same geometric shape as the resistive layer 10 so that magnetic fields caused by the currents flowing in the resistive layer 10 and in the return conducting layer 11 largely cancel each other out.

Figure 3F:
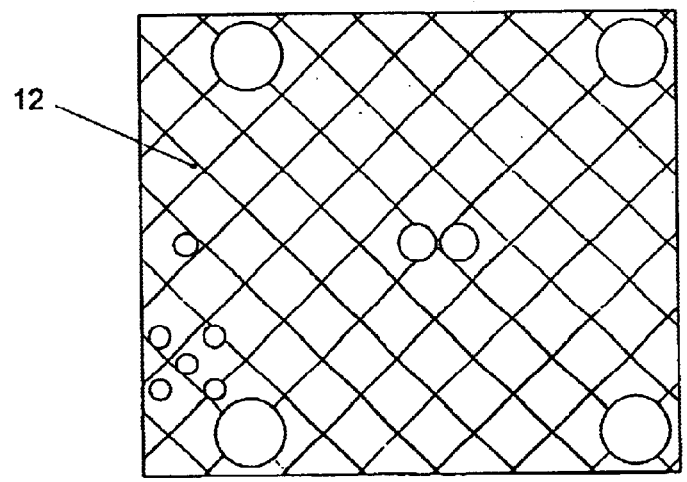

FIG. 3f shows the insulating layer 12 preferably made of solder resist and having the same geometrical shape as the insulating layer 7 (cf. FIG. 3a), which insulates the return conducting layer 11 from the cooling body 13.

FIG. 4 finally shows a diagram of a cross-section of the measurement resistor 1 according to the invention to demonstrate the dimensional relationships. Above the cooling body 13, an insulating layer 12 made of solder resist is provided on the lower side of the return conducting layer 11. The insulating layer 12 has a thickness of 50 $\mu$m, e.g., whereas the return conducting layer 11 may be made of 60 $\mu$m of copper. Between the resistive layer 10 and the return conducting layer 11, an insulating layer 21, e.g. made of one or two layers of prepreg, each having a thickness of 50 $\mu$m, is arranged. The resistive layer 10 may, e.g., be made of 50 $\mu$m of Zeranin. With the assistance of an insulating layer 22 made of one or more prepreg-layers, the resistive layer 10 is laminated to a piece of a single-layer printed circuit board base material consisting of the insulating layer 23 and the connecting layer 9, wherein the insulating layer 23 may have a thickness of 1 mm, e.g., and the connecting layer 9 may have a thickness of 30 $\mu$m, e.g. Between the connector layer 8 which likewise may consist of, e.g., 60 $\mu$m of copper, and the connecting layer 9, again one or more prepreg layers having a thickness of 100 $\mu$m, e.g., is (are) arranged to form the insulating layer 24. Finally, a further insulating layer 7 (cf. FIG. 3a) made, e.g., of 50 $\mu$m solder resist, is provided on top of the connector layer 8.

Instead of the exemplary embodiments illustrated, also further variants, modified within the scope of the invention, may be provided.

What is claimed is:

1. An electrical measurement resistor for measuring high frequency alternating currents incorporated into a multi-layered printed wiring board, the measurement resistor comprising:

a first conducting layer having a plurality of conductive tracks with a substantially constant width laid out in a centrosymmetric way extending from a central region towards an outside region for allowing a current to be measured to flow in a first direction, wherein at least one feed-through in the central region forms a first terminal for the current flowing in the first direction to be measured;

a resistive layer having a plurality of conductive tracks with a substantially constant width laid out in a centrosymmetric way extending from the central region towards the outside region forming a resistive element for allowing a current to be measured flowing in a second direction, that is opposed to the current flowing in the first direction, wherein at least one feed-through in the central region forms a second terminal for the current to be measured flowing in the second direction;

at least one insulating layer separating the first conductive layer from the resistive layer;

at least one separate feed-through forming a first Kelvin terminal connected to the central region of the resistive layer for tapping the voltage drop across a resistive element;

a plurality of feed-throughs in the outside region connecting the outside ends of the tracks of the conducting layer to the outside ends of the tracks of the resistive layer allowing the flow of a current to be measured;

a separate plurality of feed-throughs connected to the outside region of the resistive element forming a second Kelvin connection to the resistive element by connecting the separate plurality of feed-throughs in a further conductive element arranged on an opposite side of the conductive layer with respect to the resistive layer to allow a first connection to a voltmeter or similar measuring instrument;

at least one conductive element in a layer arranged on the opposite side of the conductive layer with respect to the resistive layer connecting the at least one separate feed-through of the first Kelvin terminal allowing a second connection to the voltmeter or similar measuring instrument, resulting in an arrangement wherein magnetic fields generated by a current to be measured are substantially confined to a space between the first conducting layer and the resistive layer and magnetic fields coupled with the Kelvin loop for measuring a tapped voltage drop are substantially zero, wherein currents flowing in the individual tracks carrying the current to be measured are independent of frequency because of the centrosymmetric layout leading to identical resistance and inductance in each of the paths connected in parallel, wherein there is no part of the Kelvin loop that is common to the loop of the current to be measured made from a different material than that of the resistive layer leading to an overall temperature error of the measurement resistor that is substantially identical to that of the resistive layer alone, and wherein heat dissipation in the elements carrying the current to be measured is substantially uniform because of the substantially constant track width, in spite of the fact that the overall geometry of the resistor resembles that of a disk shunt with its non-uniform current density and heat dissipation.

2. The measurement resistor of claim 1, wherein the tracks of the conducting layer have substantially the same shape as the tracks of the resistive layer.

3. The measurement resistor of claim 1, wherein a further conducting layer is inserted between the resistive layer and the connecting layer, isolated from these layers by insulating layers on both sides of it, a major portion of this layer being connected to the outside feed-throughs carrying a current to be measured and providing electrostatic shielding for high-frequency leakage fields that could be linked with the Kelvin loop.

4. The measurement resistor of claim 3, wherein a feed-through connected to the further conducting layer serving as an electrostatic shield is used as a fifth terminal to connect this shield to the shield of a voltmeter or similar measuring instrument.

5. The measurement resistor of claim 1, wherein the overall contours of the conducting tracks of the resistive layer and the first conductive layer are substantially circular in top view.

6. The measurement resistor of claim 1, wherein the conducting tracks of the resistive layer and the first conductive layer have a substantially constant distance from each other.

7. The measurement resistor of claim 1, wherein the conducting tracks of the resistive layer and the first conductive layer extends spirally outwards from the central region.

8. The measurement resistor of claim 1, herein at least one insulating layer consists of at least one prepreg layer having a thickness of less then 0.1 mm.

9. The measurement resistor of claim 1 further comprising one or more insulating layers formed between the conducting layer and a heat sink, these one or more additional insulating layers being made or a solder resist or solder stop film.

* * * * *